(12) United States Patent
McConnell et al.

(10) Patent No.: US 11,432,448 B2
(45) Date of Patent: Aug. 30, 2022

(54) METHOD OF FORMING AN ELECTRONIC DEVICE

(71) Applicant: KEMET Electronics Corporation, Fort Lauderdale, FL (US)

(72) Inventors: John E. McConnell, Simpsonville, SC (US); John Bultitude, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 0 days.

(21) Appl. No.: 16/903,979

(22) Filed: Jun. 17, 2020

(65) Prior Publication Data
US 2020/0323112 A1 Oct. 8, 2020

Related U.S. Application Data

(62) Division of application No. 15/187,451, filed on Jun. 20, 2016, now Pat. No. 10,729,051.

(51) Int. Cl.
*H05K 13/04* (2006.01)
*H05K 3/30* (2006.01)
(Continued)

(52) U.S. Cl.
CPC .......... *H05K 13/0465* (2013.01); *H01C 1/01* (2013.01); *H01C 1/14* (2013.01); *H01C 13/02* (2013.01); *H01G 2/06* (2013.01); *H01G 4/232* (2013.01); *H01G 4/38* (2013.01); *H05K 3/301* (2013.01); *H05K 3/303* (2013.01); *H05K 3/341* (2013.01); *H05K 7/12* (2013.01); *H01C 7/008* (2013.01); *H01G 4/30* (2013.01); *H05K 1/0231* (2013.01); *H05K 1/0257* (2013.01); *H05K 3/3442* (2013.01); *H05K 2201/09845* (2013.01); *H05K 2201/10015* (2013.01); *H05K 2201/10022* (2013.01); *H05K 2201/1053* (2013.01); *H05K 2201/10219* (2013.01);
(Continued)

(58) Field of Classification Search
CPC ...... H05K 13/04; H05K 13/0465; H01C 1/01; H01C 1/14; H01G 4/232; H01G 4/30; H01G 4/38
USPC ................ 361/301–306, 760, 770–790, 803; 257/685–730
See application file for complete search history.

(56) References Cited

U.S. PATENT DOCUMENTS 3,832,603 A   8/1974  Cray et al.
5,781,415 A * 7/1998  Itoh ......................... H01L 25/50
                                                    174/541
6,297,960 B1* 10/2001 Moden ................ H01L 23/3675
                                                    257/E25.023
(Continued)

FOREIGN PATENT DOCUMENTS

CN          103999176        8/2014

*Primary Examiner* — Tuan T Dinh
(74) *Attorney, Agent, or Firm* — Joseph T. Guy; Patent Filing Specialist Inc.

(57) ABSTRACT

A method of forming an electronic device is described which comprises a stack of electronic components wherein each electronic component comprises a face and external terminations. A component stability structure is attached to at least one face. A circuit board is provided wherein the circuit board comprises circuit traces arranged for electrical engagement with the external terminations. The component stability structure mechanically engages with the circuit board and inhibits the electronic device from moving relative to the circuit board.

30 Claims, 9 Drawing Sheets

(51) Int. Cl.
*H05K 7/12* (2006.01)
*H01G 4/232* (2006.01)
*H01C 1/01* (2006.01)
*H01G 2/06* (2006.01)
*H01C 13/02* (2006.01)
*H01G 4/38* (2006.01)
*H01C 1/14* (2006.01)
*H05K 3/34* (2006.01)
*H05K 1/02* (2006.01)
*H01G 4/30* (2006.01)
*H01C 7/00* (2006.01)

(52) U.S. Cl.
CPC ............ *H05K 2201/10515* (2013.01); *H05K 2201/10606* (2013.01); *H05K 2201/10636* (2013.01); *H05K 2201/2072* (2013.01); *H05K 2203/167* (2013.01)

(56) References Cited

U.S. PATENT DOCUMENTS

| | | | | |
|---|---|---|---|---|
| 6,908,785 | B2* | 6/2005 | Kim | H01L 25/0657 438/106 |
| 7,331,799 | B1* | 2/2008 | Lee | H05K 3/301 439/68 |
| 7,663,232 | B2* | 2/2010 | Kinsley | H01L 25/0657 257/726 |
| 7,829,991 | B2* | 11/2010 | Moden | H01L 25/105 438/109 |
| 9,805,872 | B2* | 10/2017 | Miller | H01G 4/228 |
| 2008/0278217 | A1 | 11/2008 | Hankhofer et al. | |
| 2009/0034155 | A1* | 2/2009 | Devoe | H01G 4/38 361/306.3 |
| 2010/0076120 | A1 | 3/2010 | Emmerson et al. | |
| 2013/0146347 | A1* | 6/2013 | McConnell | H05K 3/303 361/301.4 |
| 2013/0343027 | A1 | 12/2013 | Perea et al. | |

* cited by examiner

METHOD OF FORMING AN ELECTRONIC DEVICE

CROSS-REFERENCE TO RELATED APPLICATIONS

This patent application is a divisional application of pending U.S. patent application Ser. No. 15/187,451 filed Jun. 20, 2016 which is incorporated herein by reference.

BACKGROUND

The present invention is related to an improved system for mounting electronic components, and particularly multi-layered ceramic capacitors (MLCCs), to a circuit board. More specifically, the present invention is related to an improved system for mounting electronic component assemblies to a circuit board while allowing for increased height to width ratios thereby augmenting ongoing efforts related to miniaturization and space utilization.

Surface mount components become mechanically unstable when their height to shortest width ratio exceeds about 3:1. Once this ratio of height to width is exceeded the component may become unstable, or top heavy, and the likelihood of toppling over during the assembly process, such as during the solder reflow process, increases dramatically. Therefore, it is necessary for the component designer to follow basic design rules to ensure that recommended height to width ratios are followed. Miniaturization within the electronics industry is forcing designers to consider new approaches in designs that increase the volumetric efficiency of every component. Generally, miniaturization deals with the reduction in surface area the component consumes when mounted to a circuit board. This has led to a desire to utilize the vertical space, or Z-axis, extending perpendicular from the surface of the circuit board thereby allowing small components to grow in height to at least the height of the tallest component mounted on the circuit board. Space in the Z-axis is typically under-utilized, primarily, because of the large number of defects and rework required to correct for toppled components. Designers have a long standing desire to maintain, or more preferably decrease, the footprint of each electronic component assembly, defined as the surface area of circuit board occupied, while increasing the height to maximize performance and overall volumetric efficiency. Unfortunately, these desires have been thwarted by conventional design standards created to insure the component is structurally stable and that it will not topple over with any induced shock or vibration during assembly. The practitioner has therefore been in a design conundrum of having to accept less volumetric efficiency or having to accept higher defects neither of which is satisfactory.

It is also desirable to maintain the use of surface mount configurations due to the advantageous manufacturing and space considerations. Surface mount configurations comprising solder pads wherein mating solder pads on the circuit board and component are used to make both electrical and mechanical joints thereby eliminating the need for conductive leads that extend through conductive vias in the circuit board.

In spite of past efforts, those of skill in the art still desire a structure which allows for increased height, perpendicular to the board, with decreases board footprint without the yield loss due to rework caused by mechanical instability due to the increased height. An improved component stability structure is provided herein.

SUMMARY

It is an object of the invention to provide an improved component stability structure for electronic component assemblies comprising electronic components, and particularly multi-layered ceramic capacitors, which allows for increased height to width ratios, based on minimum width, with high yields and minimized circuit board rework required.

A particular feature of the invention is the ability to provide a component stability structure which requires minimal circuit board redesign, especially, with regards to the circuit trace designs.

These and other advantages, as will be realized, are provided in an electronic component assembly comprising a stack of electronic components wherein each electronic component comprises a face and external terminations. A component stability structure is attached to at least one face. A circuit board is provided wherein the circuit board comprises circuit traces arranged for electrical engagement with the external terminations. The component stability structure mechanically engages with the circuit board and inhibits the electronic device from moving relative to the circuit board.

Yet another embodiment is provided in a method for forming an electronic device comprising:
providing an electronic component assembly comprising:
a stack of electronic components wherein each electronic component comprises a face and external terminations; and
a component stability structure attached to at least one face;
providing a circuit board comprising circuit traces arranged for electrical engagement with the external terminations;
mechanically engaging the component stability structure with the circuit board to inhibit the electronic device from moving relative to the circuit board; and
electrically connecting at least one external termination of the external terminations to at least one circuit trace.

DESCRIPTION

The present invention is directed to an improved component stability structure suitable for use with electronic component assemblies particularly comprising multiple electronic components, more particularly stacked electronic components and even more particularly MLCC's, with a high height to width ratio based on the shortest width. More specifically, the present invention is related to a component stability structure which allows for an increased volumetric density of electronic component assemblies, relative to the footprint, with no or minimal alteration of the circuit board and particularly no or minimal alteration of the electronic circuit traces of the circuit board.

The invention will be described with reference to the figures forming an integral non-limiting component of the disclosure. Throughout the description similar elements will be numbered accordingly.

Figure 1:
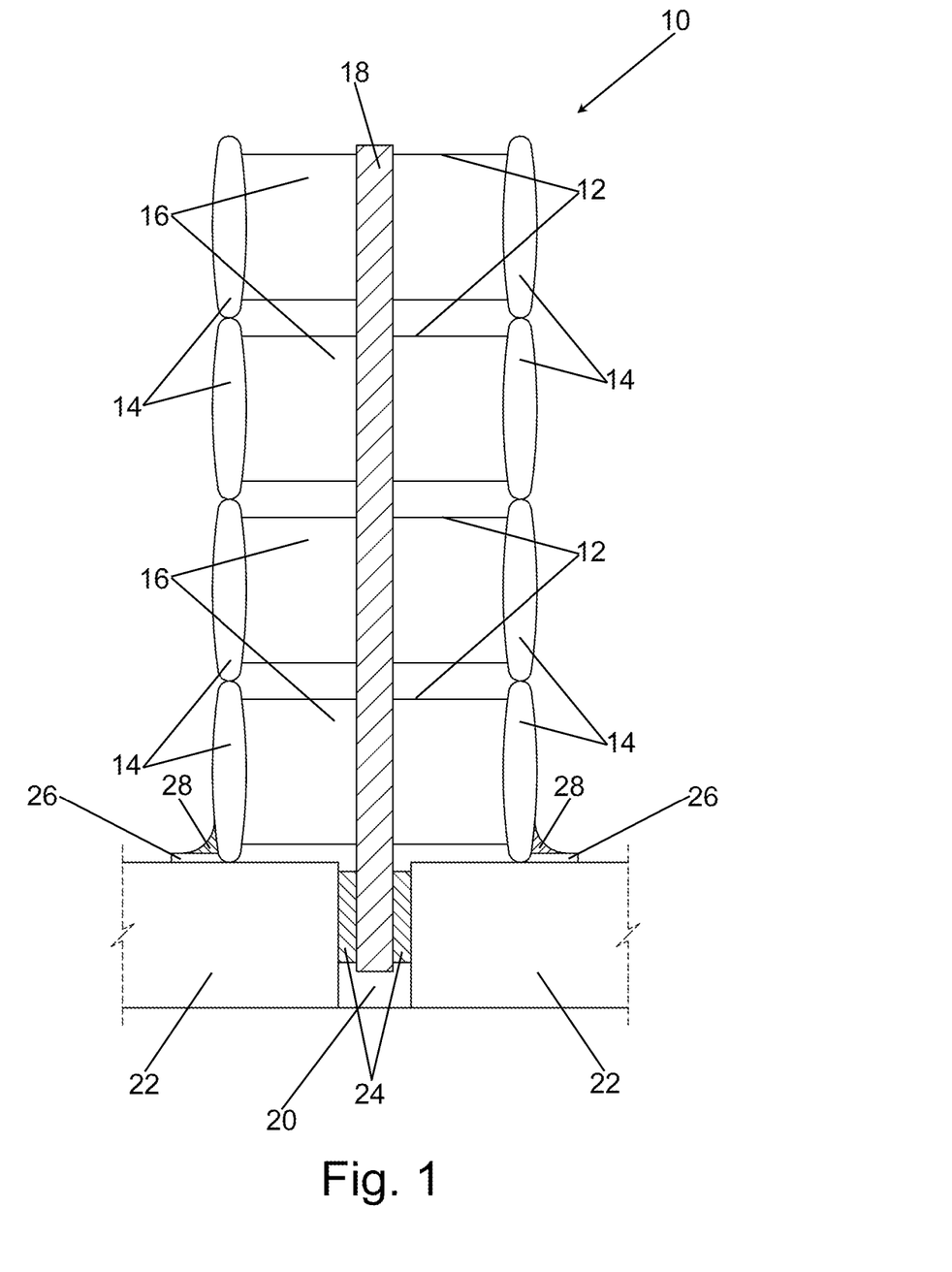
FIG. 1 is an embodiment of the invention in front side schematic view.

An electronic component assembly attached to a circuit board of an electronic device is illustrated in schematic front side view in FIG. 1. In FIG. 1, the electronic component assembly, generally represented at 10, comprises a plurality of electronic components, 12, which may be the same or different wherein each electronic component has external terminations, 14, of opposite polarity. Four electronic components are shown for the purposes of illustration without limit thereto. Each electronic component may independently represent a multilayered ceramic capacitor comprising parallel electrodes with dielectric there between wherein adjacent electrodes terminate at external terminations of opposite polarity as well known to those of skill in the art. Alternatively, each electronic component may independently have layers which form a resistor, an inductor, a thermistor, a fuse or an overvoltage protection component thereby providing resistivity, inductance, over-voltage arcing, fusing, variable resistance or other functionality either singularly or in combination with other functionality between external terminations. In particular, the present invention may provide multiple functions either in a single electronic component, or in commonly stacked electronic components, such as a fuse and an MLCC or an over-voltage protection component and an MLCC, or other combinations. The face, 16, of the electronic component, which is not part of the external electrical termination, is suitable for attachment of the component stability structure, 18, as will be more fully described herein. By attaching the component stability structure to the faces of the electronic components, wherein the face is an inert surface, defined as a surface which does not contribute to electrical functionality, a portion of the component which is otherwise not utilized provides a mechanical function thereby allowing for improved mounting capabilities without altering the electrical properties or physical shape and size of the external termination or any lead frame attached thereto. An electronic component assembly can be prepared which is surface mountable, with regards to electrical functionality, and also mounted through the use of a component stability structure for mechanical functionality.

With further reference to FIG. 1, the component stability structure, or an element of the component stability structure such as a pin, extends perpendicular to the surface of the circuit board and into a, preferably inert, via, 20, of the circuit board, 22. The pin may have a cross-sectional shape which is round, rectangular, oblong, obround, multi-faceted, such as a hexagon or octagon, or combinations thereof and may be symmetrical or asymmetrical in cross-section. The via may extend into or through the circuit board. An optional adhesive, 24, may secure the component stability structure in the via even though friction fit or a close proximity fit is preferred. The external terminations, 14, are in direct electrical contact with the circuit traces, 26, such as by a solder, 28, or a lead frame as will be more fully described herein. Direct electrical connection is defined herein as an electrical connection without additional components wherein the two elements in direct electrical connection such as by a solder joint. In FIG. 1, the external termination is in direct electrical contact with the circuit trace.

Figure 2:
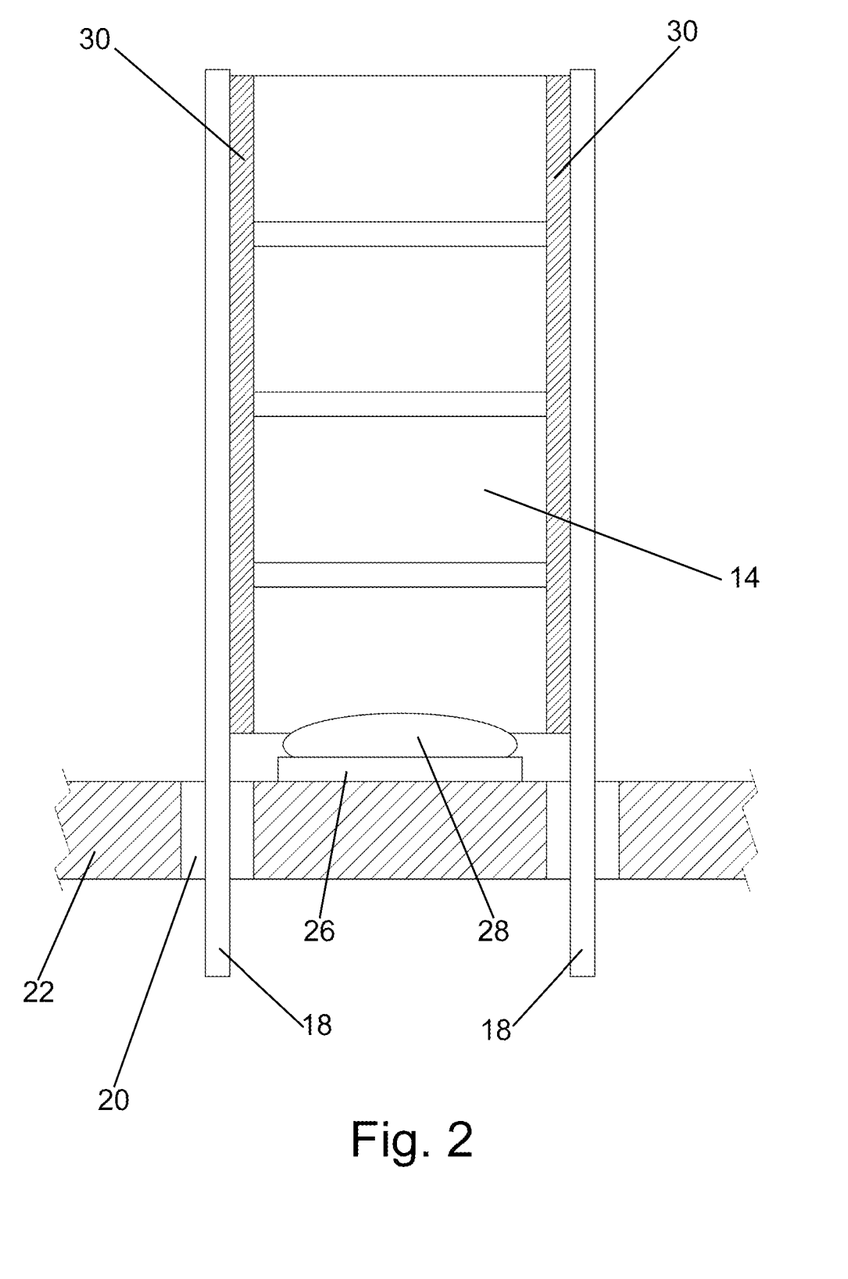
FIG. 2 is the embodiment of FIG. 1 in right side schematic view.

The embodiment of FIG. 1 is illustrated in schematic right side view in FIG. 2 wherein an adhesive, 30, is illustrated whereby the component stability structure is preferably adhered to each face wherein the faces are not visible in this view.

Figure 3:
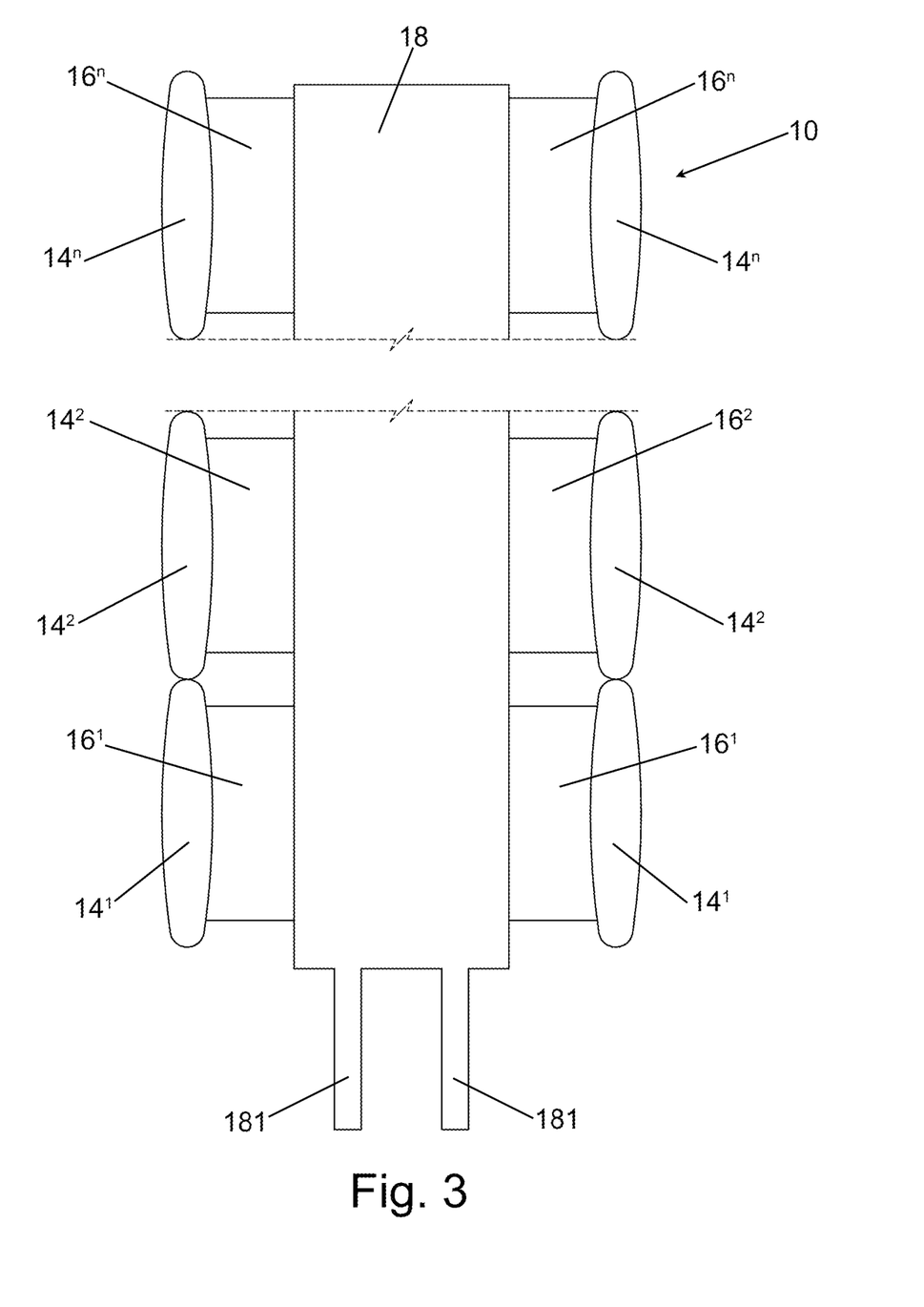
FIG. 3 is the embodiment of the invention in right side schematic view.

An embodiment of the invention will be described with reference to FIG. 3 wherein the embodiment is illustrated in partial cut-away front view with a number of stacked components designed by the superscript integer n. The number of components in the stack may be quite large and preferably at least 2 to no more than 15 are suitable for demonstration of the invention. More preferably, the number of stacked components is 2-10 with 2-5 being most preferable. In FIG. 3, the component stability structure, 18, comprises a multiplicity of pins, 181, which are received in, preferably, separate vias of the circuit board. It would be realized that one of skill in the art could utilize any number of pins on each component stability structure.

Figure 4:
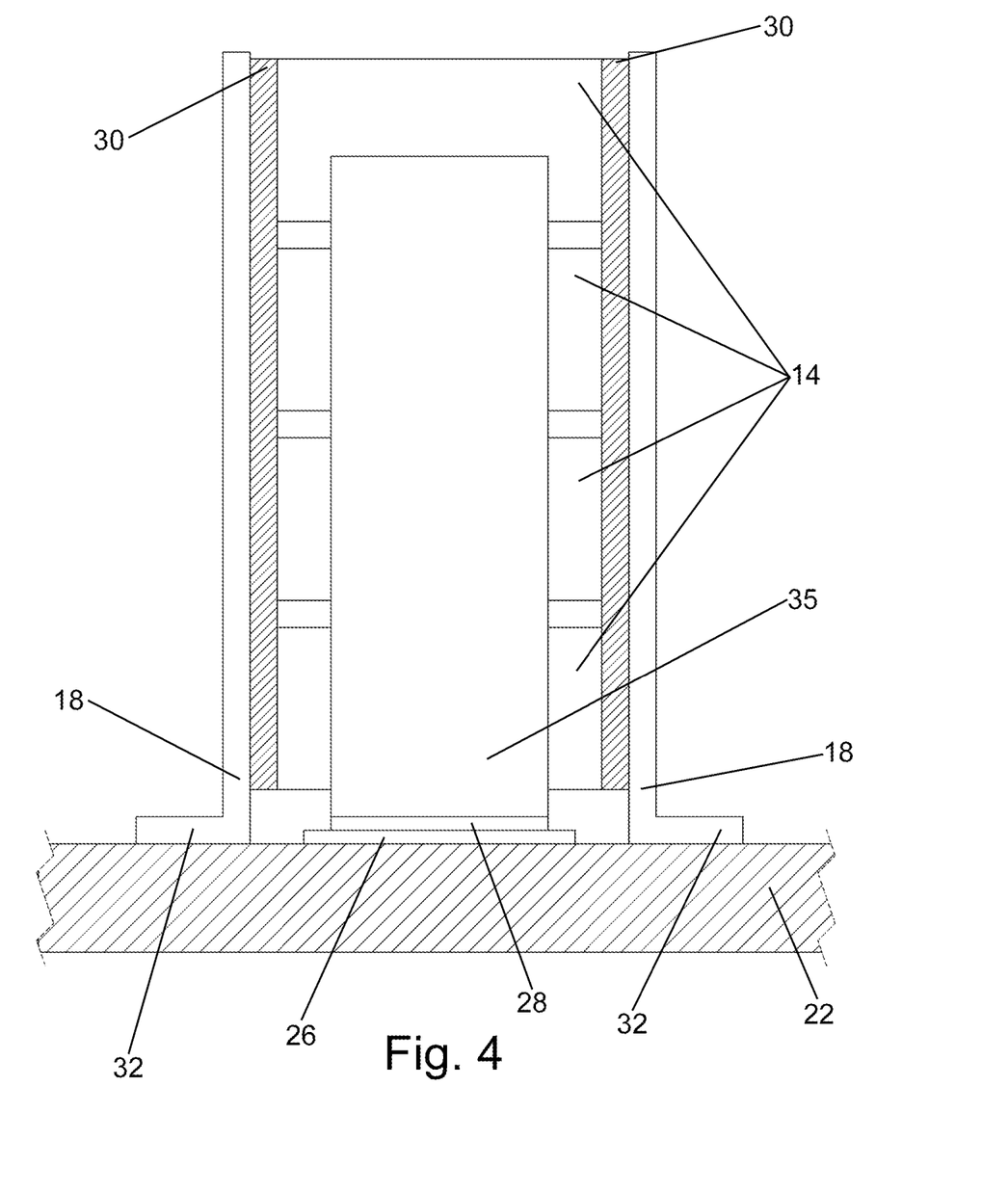
FIG. 4 is an embodiment of the invention in front side schematic view.

An embodiment of the invention will be described with reference to FIG. 4 wherein the embodiment is illustrated in right side schematic view. In FIG. 4, the component stability structure, 18, comprises a foot, 32, extending parallel to the surface of the circuit board, 22, and resting on the surface of the circuit board as opposed to a pin extending into a via of the circuit board. The component stability structure can be in contact with the circuit board surface without adhesive or may be adhered to the surface by an adhesive. The foot provides mechanical stability by mechanical engagement with the circuit board thereby inhibiting the electronic component assembly from moving relative to the circuit board. Mechanical engagement of the foot or pin can be by an adhesive, by frictional resistance to movement or by a catch mechanism as described further herein to include a physical transformation of the pin such as a bend or an engagement with a land. A lead frame, 35, in electrical contact with, preferably, all external terminations of common polarity is in electrical contact with a circuit trace, 26, such as by a solder bond, 28. The mechanical engagement between the component stability structure occurs prior to electrical engagement and may remain or the component stability structure may be removed after electrical engagement is complete.

Figure 5:
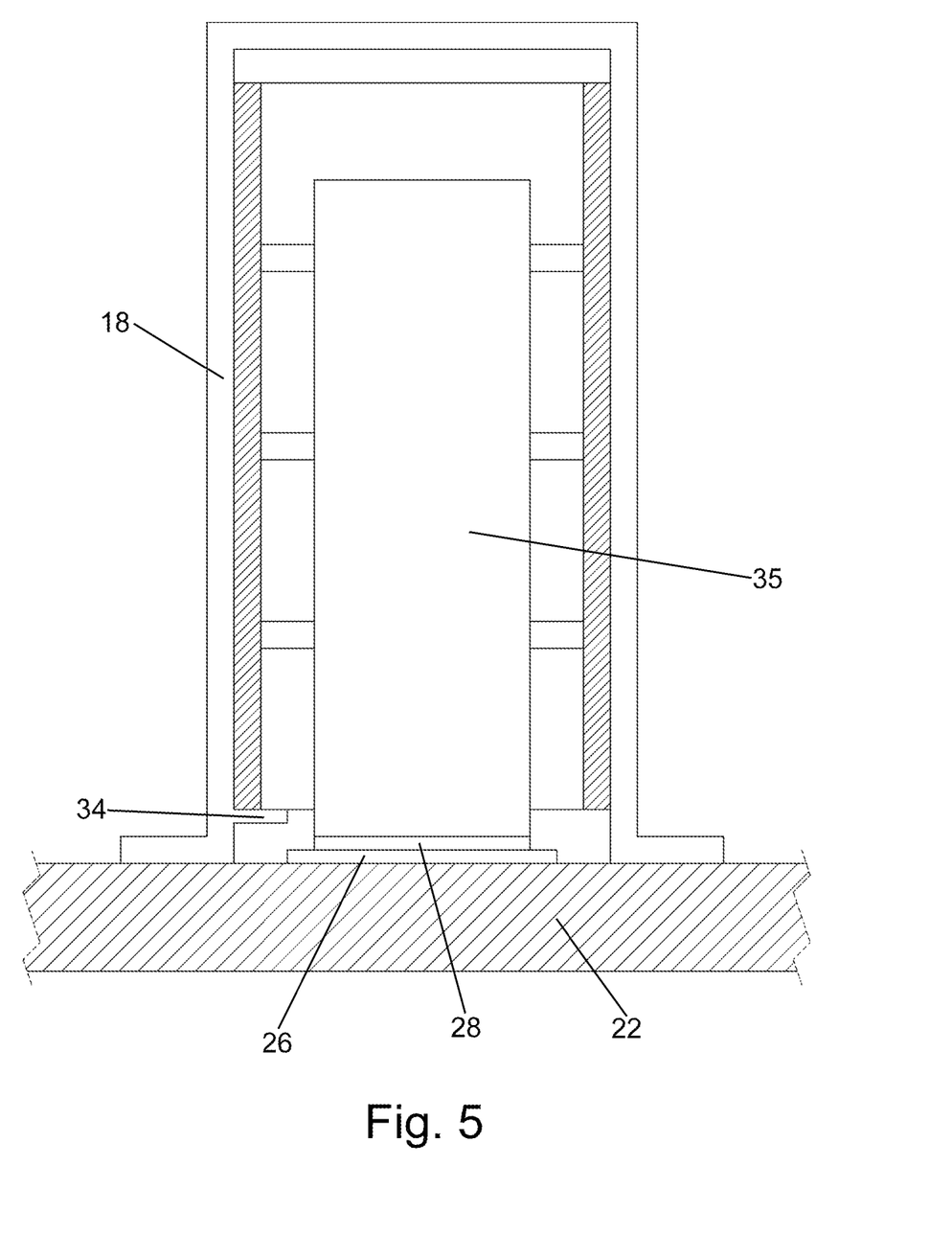
FIG. 5 is an embodiment of the invention in front side schematic view.

An embodiment of the invention will be described with reference to FIG. 5 wherein the component stability structure, 18, extends around the stack of electronic components thereby forming a partial encasement. A stability protrusion, 34, extends from the component stability structure and secures the stack of electronic components in the partial encasement thereby potentially eliminating any adhesive between the face and component stability structure. A stability protrusion can be used on either side thereby providing a component stability structure which can be flexed open, the stack inserted, and the component stability structure allowed to relax with the stack of electronic components physically secured therein.

Figure 6:
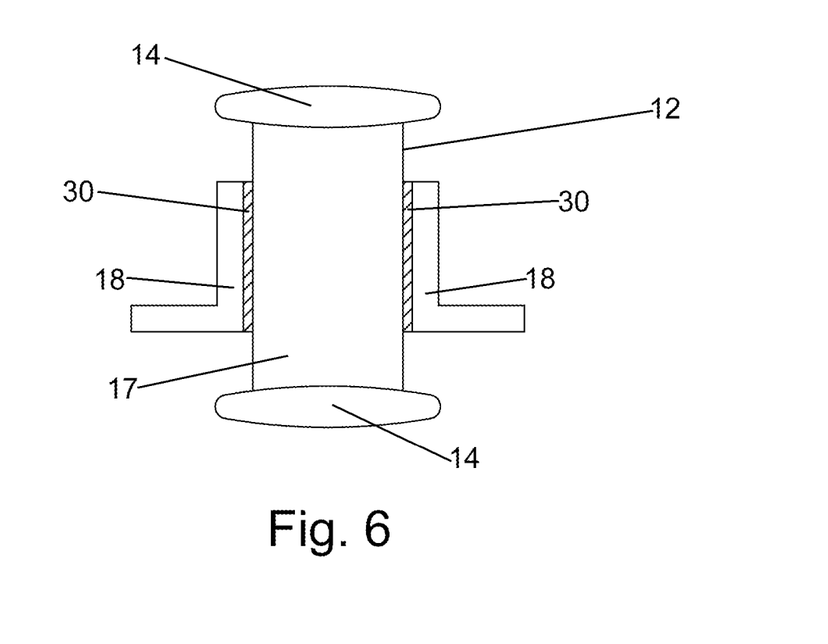
FIG. 6 is an embodiment of the invention in top side schematic view.

An embodiment of the invention is illustrated in top schematic top view in FIG. 6. In FIG. 6, the component stability structure, 18, is an angle mounted such that the long dimension is perpendicular to the circuit board. The component stability structure provides lateral support thereby inhibiting the stack from tipping in either direction. Depending on the application, and particularly time between placement and soldering, the component stability structure may be secured to the circuit board, such as by an adhesive, or gravity and lack of motion may be relied upon for the stack of electronic components to remain in place until soldering and electrical contact can be established. The component stability structure has no electrical function and therefore the footprint of the component assembly can be enlarged, as in FIG. 6, without electrical interference issues. Therefore, unlike lead frames, the component stability structure of adjacent component assemblies can be quite close, and even in contact, without detriment.

Figure 7:
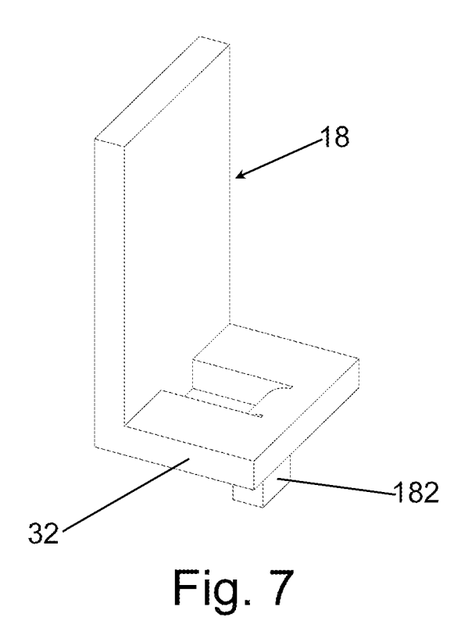
FIG. 7 is an embodiment of the invention in front perspective schematic view.

An embodiment of the invention is illustrated in side perspective view in FIG. 7. In FIG. 7, the component stability structure, 18, comprises a foot, 32, wherein a pin, 182, is punched from the component stability structure.

Figure 8:
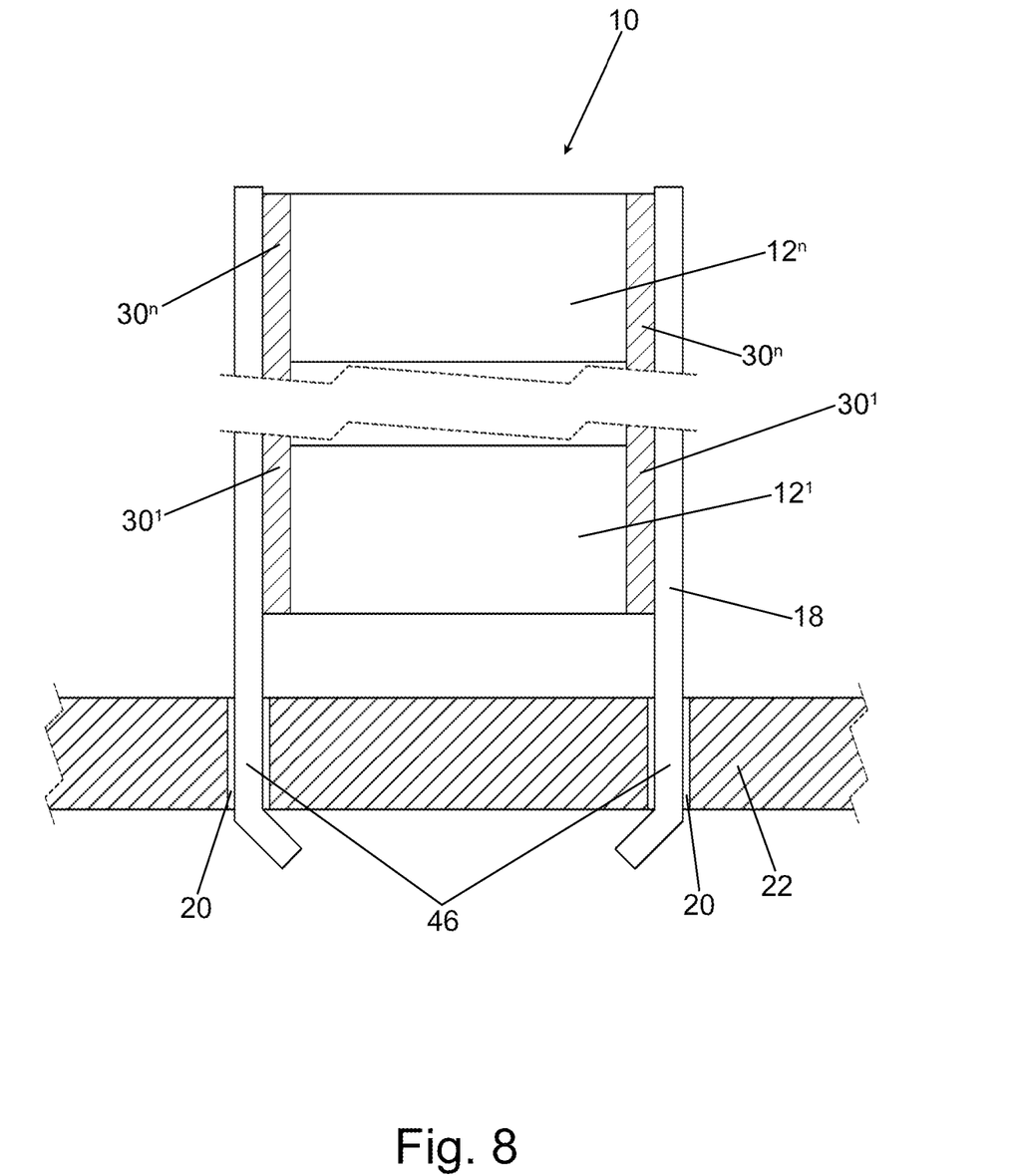
FIG. 8 is an embodiment of the invention in front side schematic view.
Figure 9:
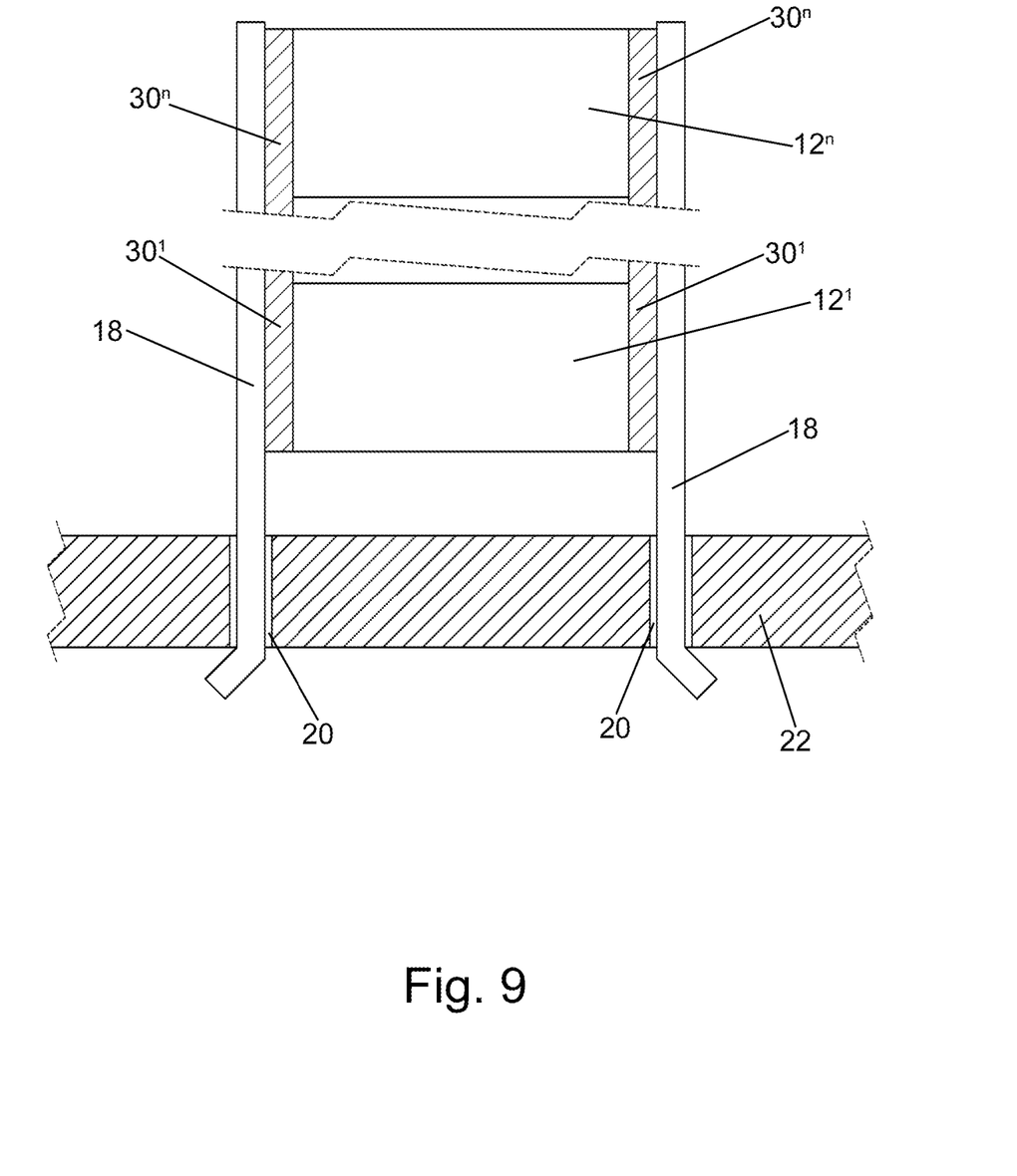
FIG. 9 is an embodiment of the invention in front side schematic view.
Figure 10:
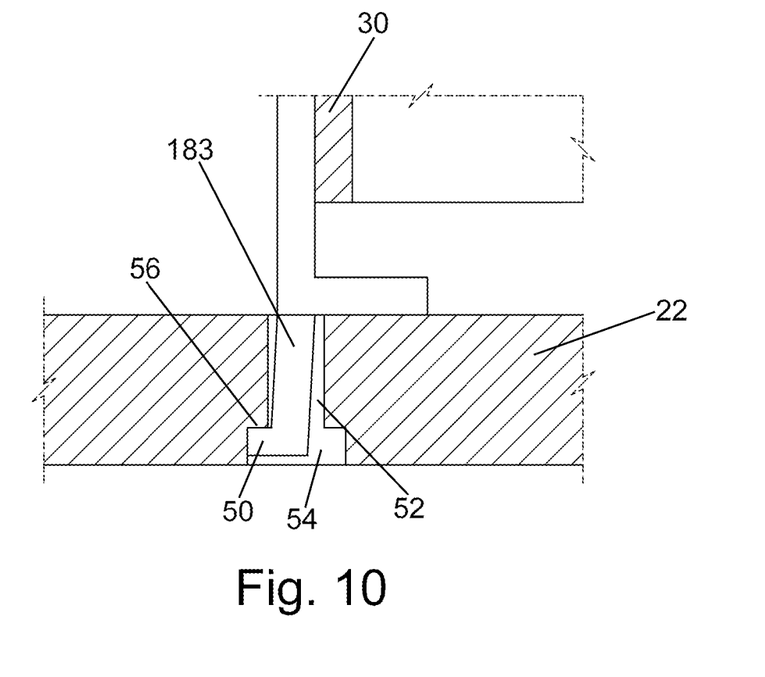
FIG. 10 is an embodiment of the invention in front side schematic view.

Embodiments of the invention are illustrated in schematic side view in FIGS. 8-10 wherein mechanical constraints or clips are illustrated. In each figure an electronic component assembly, 10, comprising a stack of electronic components, 12, between component stability structures, 18, secured by adhesive, 30, is illustrated. Extended pins, 46, are illustrated wherein extended pins are defined herein as pins that extend through the via, 20, and protrude at least partially through the circuit board, 22. In FIG. 8 the extended pins are crimped inboard, or towards each other whereas in FIG. 9 the extended pins are crimped outboard. Each electronic component assembly may comprise a single extended pin or multiple extended pins. The length for the crimped pin design is preferably the board thickness plus about 0.254+/−0.0127 cm (0.100+/−0.005 inches), this length can be varied to accommodate equipment clinching capabilities.

An embodiment of the invention is illustrated in partial schematic view in FIG. 10. In FIG. 10 the pin, 183, comprises a catch, 50, extending from the termination of the pin at an angle. The circuit board or substrate, 22, comprises a primary bore, 52, and a larger secondary bore, 54, intersecting the primary bore and opposite the side on which the electronic component assembly is to be mounted. The pin is preferably flared towards the catch and the catch, 50, is sufficiently small to traverse the primary bore and when entering the secondary bore the catch engages the land, 56, thereby securing the device in position. In one embodiment the primary bore can be formed by drilling a first hole through the substrate with the secondary bore formed thereafter with a larger drill passing only partially through the circuit board and at least overlapping the primary bore. Alternatively, the catch can pass through the substrate and engage the face of the substrate opposite the component wherein the face functions as a land.

The component stability structure allows the component designers to take advantage of the space above the circuit board to maximize the component's volumetric efficiency by increasing the height of a component while maintaining or reducing its footprint or surface area that it consumes on the circuit board. The component stability structure provides mechanical support for various types of component designs. The component stability structure is particularly suitable for use with surface mount components having high width to height aspect ratios. The component stability structure can be applied to stacks of components, and preferably MLCC's, that have height to width ratios exceeding 2:1, more preferably exceeding 3:1 and even more preferably exceeding 4:1. Though not limited herein the height to width ratio for most circuit designs, based on other considerations, is limited to about 10:1.

The component stability structure comprising a material selected from metal, plastic and a temporary material. Non-conductive materials are preferred, though not required, as non-conductive materials, particularly plastics, are typically lower cost and lighter weight. Temporary materials are materials which can be removed by thermal treatment, optical treatment or chemical treatment and are particularly suitable as they can be utilized to secure the component assembly in place and the removed after the component is secured. Particularly suitable removable materials include thermoplastics.

The component stability structure may be attached to the face of the electronic component by an adhesive such as an epoxy, an acrylate or silicone adhesive.

The invention has been described with particular reference to preferred embodiments without limit thereto. One of skill in the art would realize additional embodiments and improvements which are not specifically enumerated but which are within the scope of the invention as specifically set forth in the claims appended hereto.

The invention claimed is:

1. A method for forming an electronic device comprising:
providing an electronic component assembly comprising:
a stack of electronic components wherein each electronic component of said electronic components comprises a face and external terminations on said face wherein said face further comprises an inert surface; and
a component stability structure attached directly to said inert surface;
providing a circuit board comprising circuit traces arranged for electrical engagement with said external terminations;
mechanically engaging said component stability structure with said circuit board to inhibit said electronic component from moving relative to said circuit board wherein said component stability structure does not contribute to electrical functionality; and
electrically connecting at least one external termination of said external terminations to at least one circuit trace of said circuit traces.

2. The method for forming an electronic device of claim 1 further comprising removing said component stability structure after said electrically connecting.

3. The method for forming an electronic device of claim 1 wherein said mechanically engaging comprises an engagement selected from the group consisting of an adhesive, friction resistance and a catch mechanism.

4. The method for forming an electronic device of claim 1 wherein said stack of electronic component assembly further comprises at least one lead wherein said lead is electronically connected to at least one circuit trace of said circuit traces.

5. The method for forming an electronic device of claim 1 wherein said electrically connecting comprises forming a direct electrical connection between at least one said external termination of said external terminations and at least one circuit trace of said circuit traces.

6. The method for forming an electronic device of claim 1 wherein at least one said electronic component is a multilayered ceramic capacitor comprising parallel internal electrodes with dielectric there between wherein adjacent internal electrodes are in electrical contact with separate said external terminations.

7. The method for forming an electronic device of claim 1 wherein at least one said electronic component is selected from the group consisting of a resistor, an inductor, a thermistor, a fuse and an overvoltage protection component.

8. The method for forming an electronic device of claim 1 wherein said stack of electronic components comprises at least 2 of said electronic components.

9. The method for forming an electronic device of claim 8 wherein said stack of electronic components comprises no more than 15 of said electronic components.

10. The method for forming an electronic device of claim 9 wherein said stack of electronic components comprises at least 2 to no more than 10 of said electronic components.

11. The method for forming an electronic device of claim 10 wherein said stack of electronic components comprises at least 2 to no more than 5 of said electronic components.

12. The method for forming an electronic device of claim 1 wherein said component stability structure comprises a foot extending parallel to a surface of said circuit board.

13. The method for forming an electronic device of claim 1 wherein said component stability structure comprises a pin extending perpendicular to a surface of said circuit board.

14. The method for forming an electronic device of claim 13 wherein said pin extends at least into a via of said circuit board.

15. The method for forming an electronic device of claim 14 wherein said via is an inert via.

16. The method for forming an electronic device of claim 14 wherein said via comprises a land.

17. The method for forming an electronic device of claim 14 wherein said pin comprises a crimp.

18. The method for forming an electronic device of claim 17 wherein said pin comprises a catch.

19. The method for forming an electronic device of claim 17 wherein said pin comprises a catch engageable with a land of said circuit board.

20. The method for forming an electronic device of claim 19 wherein said land is in said via.

21. The method for forming an electronic device of claim 13 wherein said pin has a cross-sectional shape selected from round, rectangular, oblong, obround, multi-faceted, such as a hexagon or octagon, or combinations thereof.

22. The method for forming an electronic device of claim 1 wherein said component stability structure comprises a foot extending parallel to a surface of said circuit board and a pin extending perpendicular to said surface of said circuit board.

23. The method for forming an electronic device of claim 1 wherein said component stability structure comprising a material selected from metal, plastic and a removable material.

24. The method for forming an electronic device of claim 23 wherein said component stability structure comprises a thermoplastic.

25. The method for forming an electronic device of claim 1 further comprising an adhesive between said component stability structure and said circuit board.

26. The method for forming an electronic device of claim 25 wherein said adhesive is selected from the group consisting of epoxies, acrylates, silicones.

27. The method for forming an electronic device of claim 1 wherein said component stability structure comprising a non-adhesives constraint.

28. The method for forming an electronic device of claim 27 wherein said non-adhesives constraint is selected from a compressive mechanical constraint and a clip.

29. The method for forming an electronic device of claim 1 wherein said component stability structure partially encases said stack of electronic components.

30. The method for forming an electronic device of claim 1 wherein said component stability structure further comprises at least one stability protrusion.

* * * * *